US006405447B2

(12) United States Patent
Nyen

(10) Patent No.: US 6,405,447 B2
(45) Date of Patent: *Jun. 18, 2002

(54) ALIGNMENT DEVICE FOR ELECTRICALLY CONNECTING A TESTING DEVICE TO A SLIDING PLATE ON A CONVEYER

(75) Inventor: Lee Tiek Nyen, Perak (MY)

(73) Assignee: Acer Communications and Multimedia Inc., Taoyuan (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/122,199

(22) Filed: Jul. 23, 1998

(51) Int. Cl.[7] .................. G01D 21/00; H01R 13/64
(52) U.S. Cl. .......................... 33/645; 439/680
(58) Field of Search ................ 33/645, 644, 613, 33/533; 439/680, 681, 554, 567, 674, 677

(56) References Cited

U.S. PATENT DOCUMENTS

| 2,659,872 A | * | 11/1953 | Gilbert ................. 439/680 |
| 2,968,872 A | * | 1/1961 | Welles .................. 33/645 |
| 3,709,163 A | * | 1/1973 | Smedley et al. ......... 108/53 |
| 4,072,402 A | * | 2/1978 | Butler .................. 439/680 |
| 4,350,401 A | * | 9/1982 | Allen et al. ........... 339/65 |
| 4,957,462 A | * | 9/1990 | Erickson ............... 33/645 |
| 5,742,168 A |   | 4/1998 | Kiyokawa et al. |
| 5,875,560 A | * | 3/1999 | Boe et al. ............. 33/645 |

FOREIGN PATENT DOCUMENTS

| JP | 363201808 | * | 8/1988 | ............ 33/645 |
| TW | 272257 |   | 3/1996 | |

* cited by examiner

Primary Examiner—Diego Gutierrez
Assistant Examiner—Lydia M. De Jesús
(74) Attorney, Agent, or Firm—Winston Hsu

(57) ABSTRACT

The present invention relates to an alignment device for electrically connecting a testing device to a socket of a sliding plate. The testing device is positioned beside a conveyer. The sliding plate is slidably placed on the conveyer and is temporarily halted in front of the testing device. The alignment device comprises a positioning device fixed on the socket of the sliding plate, a plug electrically connected to the testing device, a guiding device fixed on the plug, a driving device installed beside the testing device for pushing the plug and the guiding device toward the socket and the positioning device of the sliding device, and a mounting device installed on the driving device for slidably supporting the plug and the guiding device. The guiding device is used for interacting with the positioning device to adjust the position of the plug on the mounting device. When the plug is pushed toward the socket of the sliding plate, the guiding device will interact with the positioning device so that the plug can be plugged into the socket of the sliding plate.

5 Claims, 4 Drawing Sheets

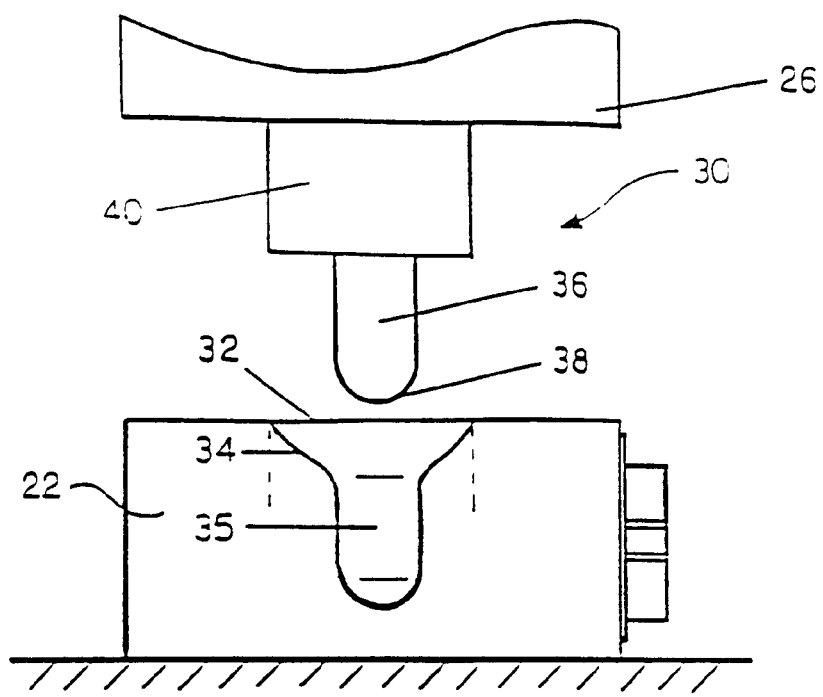
FIG. 4
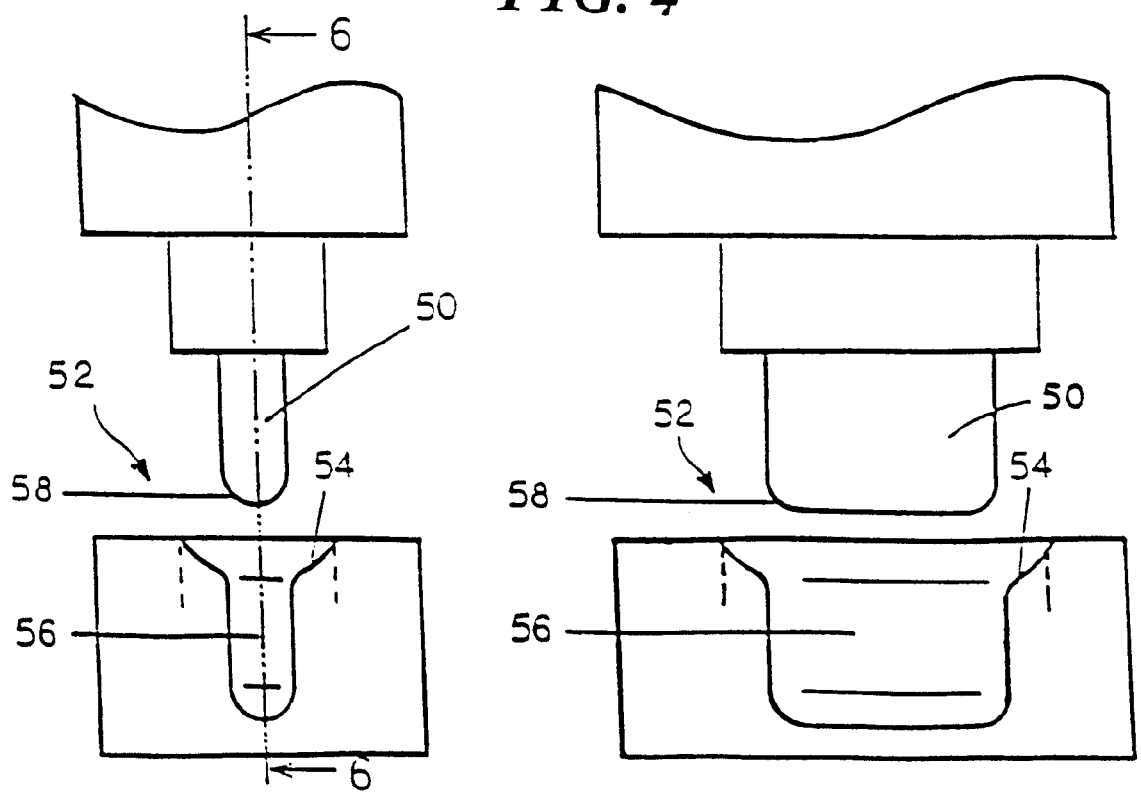
FIG. 5
FIG. 6

ALIGNMENT DEVICE FOR ELECTRICALLY CONNECTING A TESTING DEVICE TO A SLIDING PLATE ON A CONVEYER

BACKGROUND OF THE INVENTION

1. Field of the Invention

The present invention relates to an alignment device of a testing device, and more particularly, to an alignment device for electrically connecting a testing device to a sliding plate on a conveyer.

2. Description of the Prior Art

Many electronic factories use computer controlled conveyers and sliding plates to transport electronic products to various assembly stations or testing stations. Some of these electronic factories use automatic facilities to electrically connect a testing device to a socket of the sliding plate.

Please refer to FIG. 1 and FIG. 2. FIG. 1 is a prior art alignment device 10 for automatically connecting a testing device 15 to a socket 12 of a sliding plate 11. FIG. 2 is a perspective view of the plug 14 and the socket 12 shown in FIG. 1. The alignment device 10 and the testing device 15 are installed beside a conveyer 17. The sliding plate 11 is slidably installed on the conveyer 17 and can be temporarily halted in front of the testing device 15 and alignment device 10 during performance of a test. The alignment device 10 is electrically controlled by the testing device 15. It comprises a plug 14 electrically connected to the testing device 15, and a driving device 16 having a driving arm 19 for pushing the plug 14 toward the socket 12 of the sliding plate 11. The socket 12, which is electrically connected to an electronic product 13 placed on the sliding plate 11, comprises a plurality of recesses 18 with electric wires, and the plug 14 comprises a plurality of correspondent probes 20.

When the sliding plate 11 is transported by the conveyer 17 to a predetermined position in front of the testing device 15, the testing device 15 will use the driving arm 19 of the driving device 16 to push the plug 14 toward the socket 12 of the sliding plate 11 to electrically connect the probes 20 of the plug 14 with the correspondent recesses 18 of the socket 12. When the plug 14 is electrically connected with the socket 12 of the sliding plate 11, the testing device 15 will start to test the electronic product 13 placed on the sliding plate 11. When a test is completed, the testing device 15 will use the driving device 16 to disconnect the plug 14 from the socket 12, and the sliding plate 11 will be transported to a subsequent working station by the conveyer 17.

In order to minimize possible positioning errors when the probes 20 of the plug 14 are pushed toward the recesses 18 of the socket 12, large diameters of the recesses 18 and long distances between adjacent probes 20 are necessary. Although such an arrangement car effectively reduce possible errors, it will also reduce the number of probes 20 and recesses 18 because a total contact area between the plug 14 and the socket 12 is fixed. Since many sophisticated electronic products need to be tested with many probes, such an arrangement is unacceptable.

SUMMARY OF THE INVENTION

It is therefore a primary objective of the present invention to provide an alignment device used for connecting a testing device with a conveyer to solve the above mentioned problems.

In a preferred embodiment, the present invention provides an alignment device for electrically connecting a testing device to a socket of a sliding plate over which the testing device is positioned beside a conveyer and the sliding plate is slidably placed on the conveyer and is temporarily halted in front of the testing device, the alignment device comprising:

a positioning device fixed on the socket of the sliding plate;

a plug electrically connected to the testing device;

a guiding device fixed on the plug;

a driving device installed beside the testing device for pushing the plug and the guiding device toward the socket and the positioning device of the sliding device; and a mounting device installed on the driving device for slidably supporting the plug and the guiding device;

wherein when the plug is pushed toward the socket of the sliding plate by the driving device, the guiding device will interact with the positioning device to adjust the position of the plug on the mounting device so that the plug can be plugged into the socket of the sliding plate.

It is an advantage of the present invention that the alignment device comprises a guiding device and a positioning device so that more probes and recesses can be installed on the plug and the socket without the problem of positioning errors, and thus sophisticated electronic products can be tested more easily.

This and other objectives of the present invention will no doubt become obvious to those of ordinary skill in the art after read the following detailed description of the preferred embodiment which is illustrated in the various figures and drawings.

BRIEF DESCRIPTION OF THE DRAWINGS

FIG. 4 is a sectional view along line 4—4 of the alignment device shown in FIG. 3.

FIG. 5 is a sectional view of an alternative guiding device and positioning hole of the alignment device shown in FIG. 3.

FIG. 6 is a sectional view along line 6—6 of the alignment device shown in FIG. 5.

DETAILED DESCRIPTION OF THE PREFERRED EMBODIMENT

Figure 1:
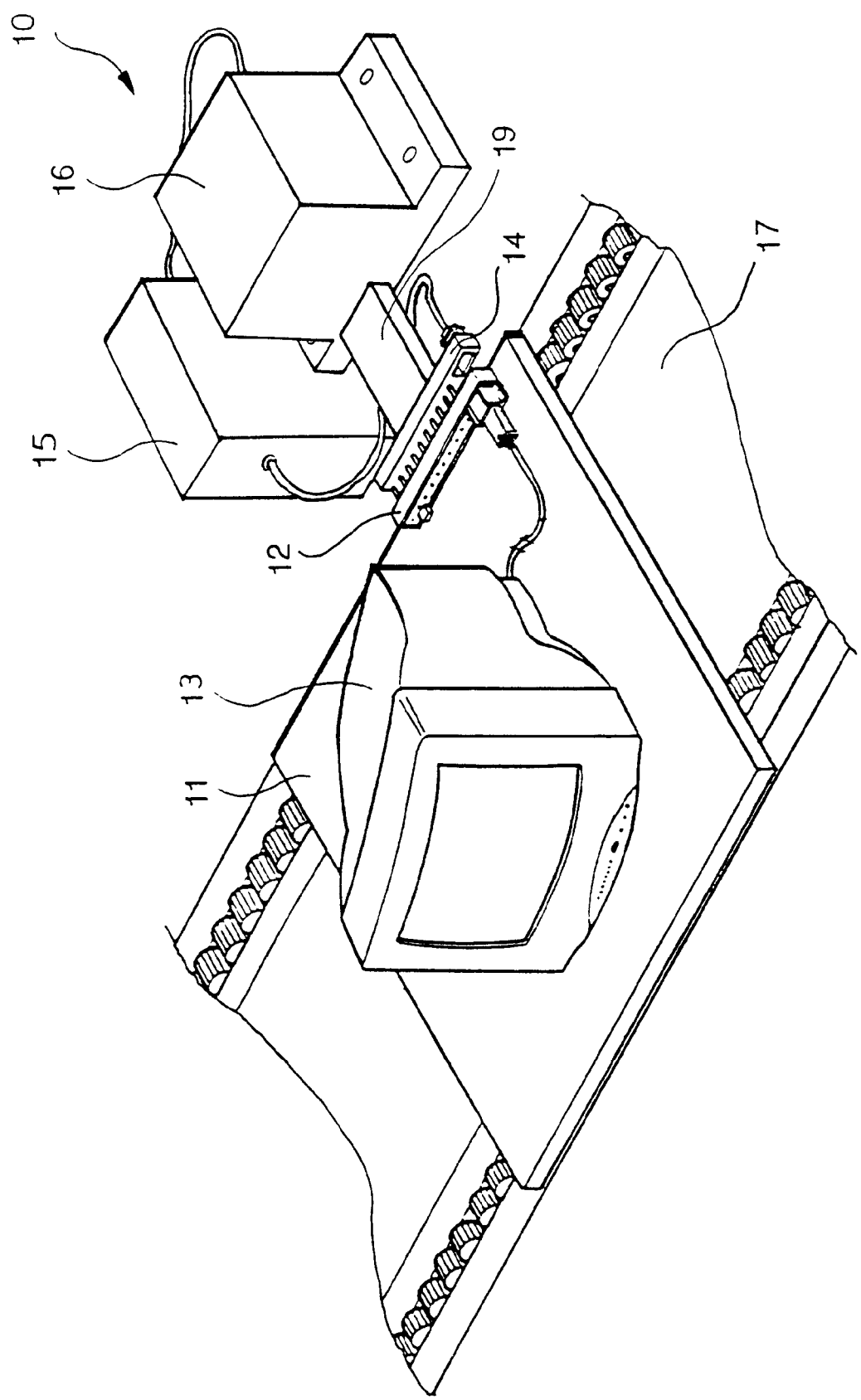
FIG. 1 is a perspective view of a prior art alignment device electrically connected with a testing device and a socket of a sliding plate.
Figure 2:
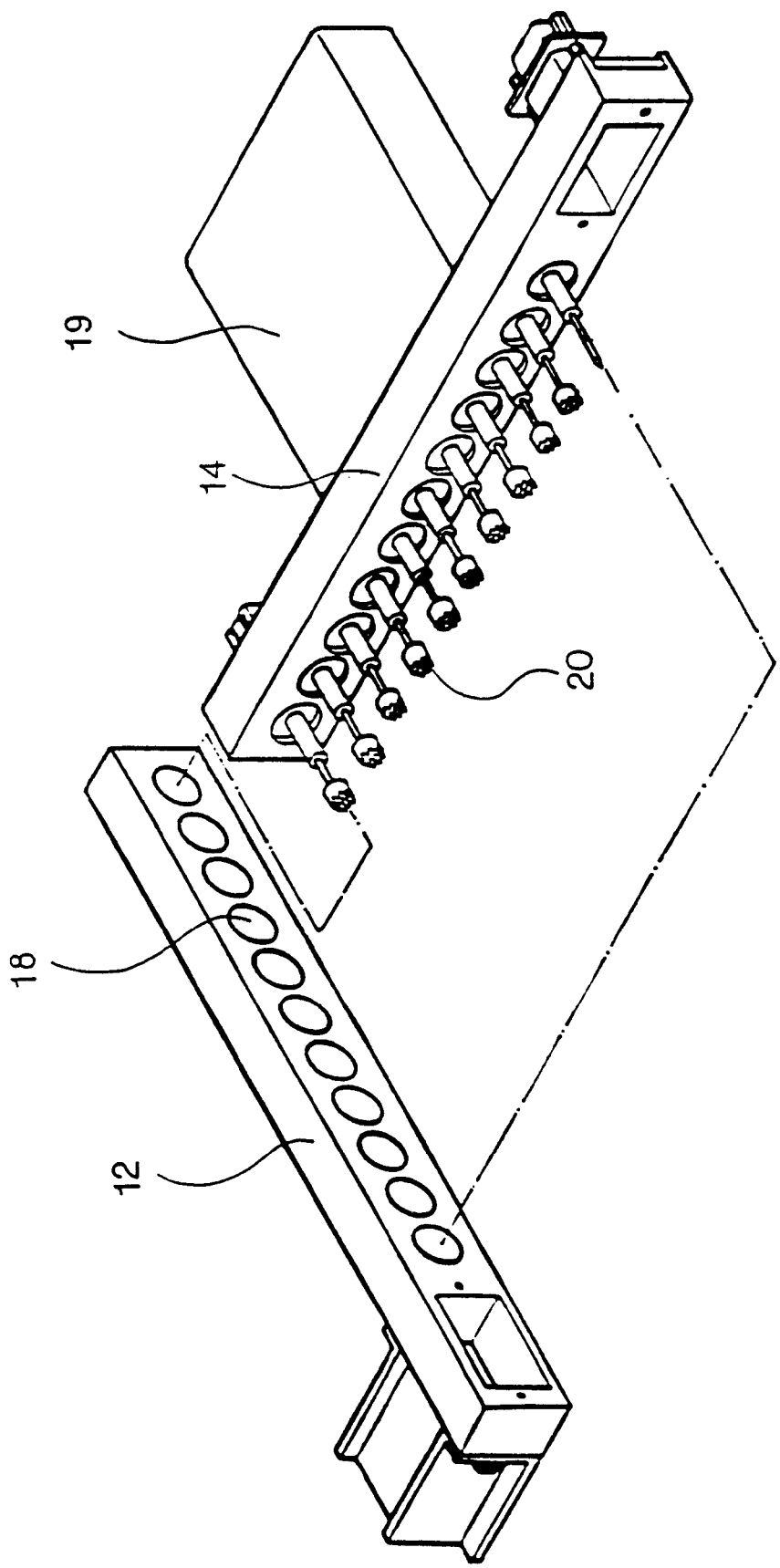
FIG. 2 is a perspective view of the plug and the socket shown in FIG. 1.
Figure 3:
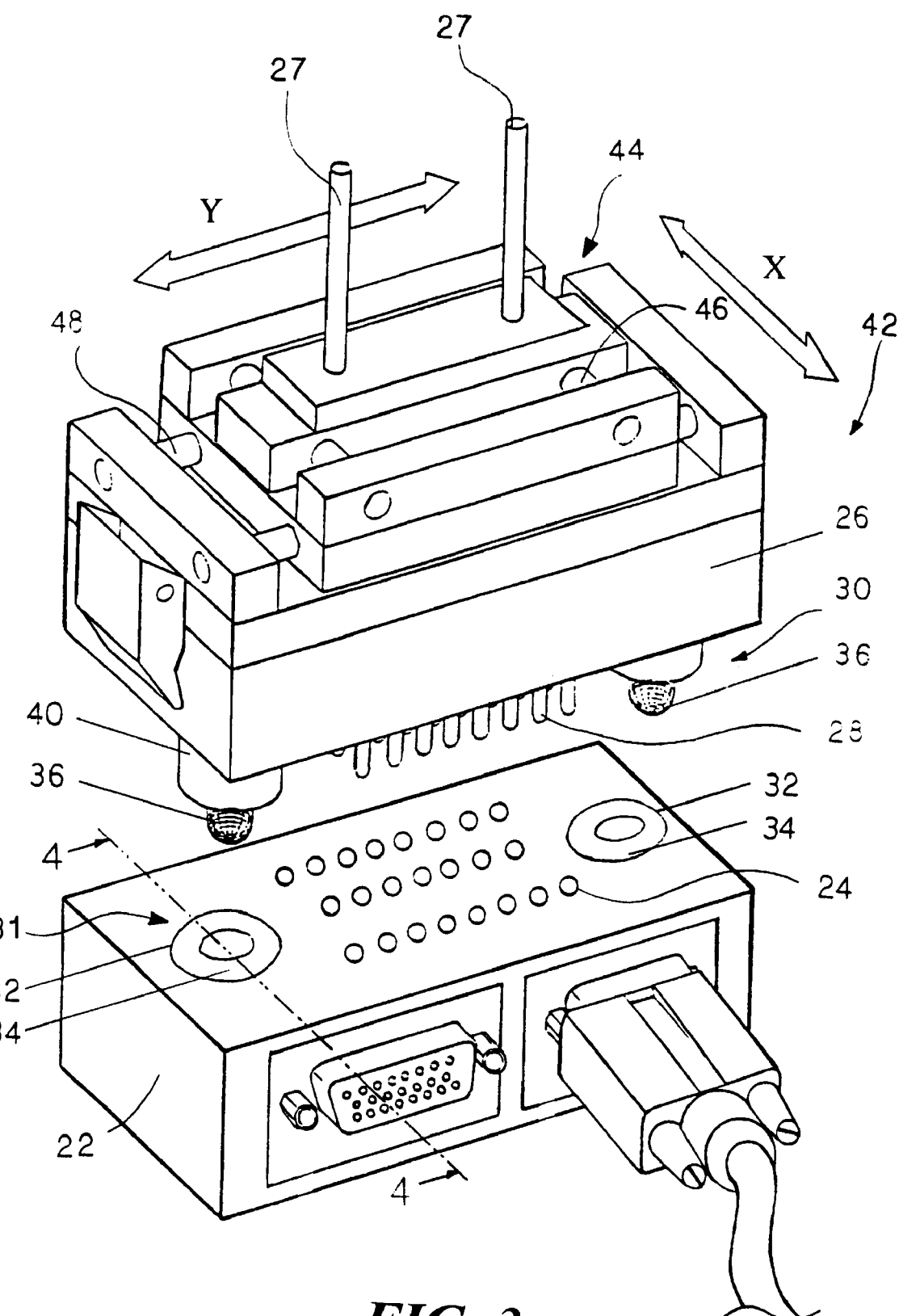
FIG. 3 is a perspective view of an alignment device according to the present invention.

Please refer to FIG. 3 and FIG. 4. FIG. 3 is a perspective view of an alignment device 42 according to the present invention. FIG. 4 is a sectional view along line 4—4 of the alignment device 42 shown in FIG. 3. The alignment device 42 has an arrangement similar to the prior art alignment device 10 shown in FIG. 1. A socket 22 is fixed on a sliding plate, and a plug 26 is vertically fixed by two driving arms 27 on a driving device (not shown). The arrangement of the alignment device 42 will be further described in the following text.

The alignment device 42 comprises a positioning device 31 comprising two positioning holes 32 installed on the socket 22 on the sliding plate, a plug 26 electrically connected to a testing device comprising a plurality of probes 28 installed on its bottom side, a guiding device 30 comprising two guiding poles 36 installed on the bottom side of the plug 26, two driving arms 27 installed below the driving device for pushing the plug 26 and the guiding device 30 downward toward the socket 22 and positioning holes 32 separately, and a mounting device 44 installed on bottom ends of the two driving arms 27 for slidably supporting the plug 26 and the guiding device 30 below the driving arms 27. The mounting device 44 comprises two x-directional sliding rods 46 for sliding the plug 26 and guiding device 30 along an x direction, and two y-directional sliding rods 48 for sliding the plug 26 and guiding device 30 along a y direction. The x and y directions make a two-dimensional plane perpendicular to the direction in which the driving arms 27 push the plug 26 and the guiding device 30. By sliding the plug 26 and guiding device 30 along the X and Y directions, their positions relative to the socket 22 and the positioning device 31 can be changed.

The guiding device 30 interacts with the positioning device 31 on the sliding plate for adjusting a position of the plug 26 relative to the socket 22. Each of the guiding poles 36 comprises a ball shaped head 38 and each of the positioning holes 32 comprises a funnel shaped neck portion 34 and a positioning tube 35. Each guiding pole 36 of the guiding device 30 is longer than each of the probes 28. As the plug 26 is pushed downward, the guiding poles 36 will first engage with the funnel shaped neck portion 34 of the two positioning holes 32 and then will be guided into the positioning tubes 35 at the bases of the positioning holes 32. At this time, the plug 26 mounted with the guiding poles 36 will be pushed toward the socket 22 allowing the plurality of probes 28 on the bottom side of the plug 26 to be plugged into each correspondent recess 24 on the socket 22. The guiding poles 36 above the positioning holes 32 are elastically fixed by rubber pads 40 installed on top ends of the guiding poles 36 to avoid traumatic damage when the plug 26 is mounted to the socket 22.

Because the size of the funnel shaped neck portion 34 of the positioning holes 32 is directly proportional to the relative positioning errors between the socket 22 of the movable sliding plate 11 and the plug 26 of the fixed alignment device 42, the positioning errors will be automatically corrected by the guiding device 30, the mounting device 44, and the positioning device 31 installed on the socket 22. Since the positioning errors between the sliding plate 11 and the alignment device 42 are corrected before the probes 28 of the plug 26 are plugged into the recesses 24 of the socket 22 the probes 28 and the recesses 24 can easily be properly matched. The possibility of positioning errors can be effectively reduced. This will also allow more probes 28 and recesses 24 to be installed on the plug 26 and the socket 22.

In addition, the two guiding poles 36 of the guiding device 30 can adjust the position of the sliding plate 11 slightly if the socket 22 of the sliding plate 11 is not precisely in parallel with the plug 26 of the alignment device 42. After the two guiding poles 36 of the guiding device 30 are moved to the two positioning tubes 35 of the positioning holes 32, the guiding device 30 will move the sliding plate 11 slightly to bring the socket 22 into alignment with the plug 26. The two guiding poles 36 of the guiding device 30 can also be replaced by an alternative single guiding pole. FIG. 5 and 6 show such an example.

Please refer to FIGS. 5 and 6. FIG. 5 is a sectional view of an alternative guiding pole 50 and positioning hole 52 of the alignment device 42 according to the present invention. FIG. 6 is a sectional view along line 6—6 in FIG. 5. The guiding pole 50 comprises a rectangular shaped head 58, the positioning hole 52 comprises a funnel shaped neck portion 54 and a rectangular shaped recess 56. Besides, the rectangular shaped head 58 and the rectangular shaped recess 56 can slightly rotate the sliding plate 11 and improve the positioning operation if the plug 26 is not precisely parallel to the socket 22. As shown in this embodiment, the two sets of ball shaped head 38, funnel shaped neck portion 34 and positioning tubes 35 can be replaced by one set of rectangular shaped head 58, funnel shaped neck portion 54 and rectangular shaped recess 56, and the positioning operation of the present invention can still be performed.

Those skilled in the art will readily observe that numerous modifications and alterations of the device may be made while remaining the teachings of the invention. Accordingly, the above disclosure should be construed as limited only by the metes and bounds of the appended claims.

What is claimed is:

1. An alignment device for electrically connecting a testing device to a socket of a sliding plate, the sliding plate slidably placed on a conveyer that can be temporarily halted in front of the testing device, the alignment device comprising:

a positioning device fixed on the socket of the sliding plate, the positioning device comprising a positioning hole with a substantially rectangular shaped recess, and a funnel shaped neck portion disposed over the positioning hole;

a plug electrically connected to the testing device;

a guiding device fixed on the plug, the guiding device comprising a guiding pole with a substantially rectangular shaped head, the position of the guiding pole corresponding to the position of the positioning hole;

a driving device installed beside the testing device for pushing the plug and the guiding device separately toward the socket and the positioning device of the sliding plate; and a mounting device installed on the driving device for slidably supporting the plug and the guiding device so that the plug and the guiding device are slidable in a two-dimensional plane to align the plug along an x-direction and a y-direction with the socket;

wherein the guiding device is used for interacting with the positioning device for adjusting a position of the plug relative to the socket, when the plug is pushed toward the socket of the sliding plate by the driving device, the guiding pole is guided by the funnel shaped neck portion into the positioning hole, and the substantially rectangular shaped head of the guiding pole is guided into the substantially rectangular shaped recess of the positioning hole, a shape of the substantially rectangular shaped head and a shape of the substantially rectangular shaped recess causing the guiding pole to align with the positioning hole to adjust the position of the plug on the mounting device so that the plug can be plugged into the socket of the sliding plate.

2. The alignment device of claim 1 wherein the driving device comprises a driving arm for pushing the plug and the guiding device toward the socket and the positioning device, and the mounting device is installed on the driving arm of the driving device.

3. The alignment device of claim 1 wherein the two-dimensional plane is perpendicular to the driving arm of the driving device.

4. An alignment device for accurately positioning a plug onto a sliding plate, the alignment device comprising:

a guiding device fixed on the plug, the guiding device comprising a guiding pole, the guiding pole comprising a bar-shaped head;

a positioning device disposed on the sliding plate, the positioning device comprising a positioning hole, and a funnel shaped neck portion disposed over the positioning hole, the positioning hole comprising a bar-shaped recess corresponding to the bar-shaped head;

a mounting device supporting the plug and the guiding device, the mounting device being able to slide along a first direction and a second direction, the first direction being essentially perpendicular to the second direction, so that the plug and the guiding device are slidable in a two-dimensional plane to align the plug along an x-direction and a y-direction with a socket; and a driving device installed beside the plug for pushing the plug and the guiding device toward the positioning device of the sliding plate;

wherein when the plug is pushed toward the sliding plate by the driving device, the guiding pole is simultaneously guided by the funnel shaped neck portion and pushed into the positioning hole, the bar-shaped head of the guiding pole is guided into and aligns with the bar-shaped recess of the positioning hole so that the plug is accurately positioned onto the sliding plate, a shape of the bar-shaped head and a shape of the bar-shaped recess causing the guiding pole to align with the positioning hole.

5. An alignment device for accurately positioning a plug onto a sliding plate, the alignment device comprising:

a guiding device fixed on the plug, the guiding device comprising a guiding pole, the guiding pole comprising a non-circular shaped head;

a positioning device disposed on the sliding plate, the positioning device comprising a positioning hole, and a funnel shaped neck portion disposed over the positioning hole, the positioning hole comprising a non-circular shaped recess corresponding to the non-circular shaped head;

a mounting device supporting the plug and the guiding device, the mounting device being able to slide along a first direction and a second direction, the first direction being essentially perpendicular to the second direction, so that the plug and the guiding device are slidable in a two-dimensional plane to align the plug along an x-direction and a y-direction with a socket; and a driving device installed beside the plug for pushing the plug and the guiding device toward the positioning device of the sliding plate;

wherein when the plug is pushed toward the sliding plate by the driving device, the guiding pole is simultaneously guided by the funnel shaped neck portion and pushed into the positioning hole, the non-circular shaped head of the guiding pole is guided into and aligns with the non-circular shaped recess of the positioning hole so that the plug is accurately positioned onto the sliding plate, a shape of the non-circular shaped head and a shape of the non-circular shaped recess causing the guiding pole to align with the positioning hole.

* * * * *